(12) United States Patent
Murakami et al.

(10) Patent No.: US 6,184,458 B1
(45) Date of Patent: Feb. 6, 2001

(54) PHOTOVOLTAIC ELEMENT AND PRODUCTION METHOD THEREFOR

(75) Inventors: Tsutomu Murakami; Takehito Yoshino, both of Nara; Koji Tsuzuki, Ikoma; Yoshifumi Takeyama, Kyoto; Koichi Shimizu, Kyotanabe, all of (JP)

(73) Assignee: Canon Kabushiki Kaisha, Tokyo (JP)

( * ) Notice: Under 35 U.S.C. 154(b), the term of this patent shall be extended for 0 days.

(21) Appl. No.: 09/327,569

(22) Filed: Jun. 8, 1999

(30) Foreign Application Priority Data

Jun. 11, 1998 (JP) .................................................. 10-178010
Jun. 3, 1999 (JP) .................................................. 11-157040

(51) Int. Cl.$^7$ .................................................. H01L 31/00
(52) U.S. Cl. .......................................... 136/256; 136/293
(58) Field of Search ..................................... 136/256, 293

(56) References Cited

U.S. PATENT DOCUMENTS 4,997,491 * 3/1991 Hokuyo et al. ....................... 136/255

FOREIGN PATENT DOCUMENTS 4-42974   2/1992 (JP) .
5-152596  6/1993 (JP) .

\* cited by examiner

*Primary Examiner*—Mark Chapman
(74) *Attorney, Agent, or Firm*—Fitzpatrick, Cella, Harper & Scinto (57) ABSTRACT

A photovoltaic element with a low shadow, a high energy conversion efficiency, a high freedom in dimension and a high reliability with prolonged use is provided. The photovoltaic element comprises a photovoltaic layer having a first semiconductor junction layer for generating an electromotive force, a current collecting electrode provided at the light incident side of the photovoltaic layer, and a bypass diode connected in parallel, wherein the bypass diode is provided under the current collecting electrode as a bypass diode layer having a second semiconductor junction layer other than the first semiconductor junction layer of the photovoltaic layer.

20 Claims, 8 Drawing Sheets

PHOTOVOLTAIC ELEMENT AND PRODUCTION METHOD THEREFOR

BACKGROUND OF THE INVENTION

1. Field of the Invention

The present invention relates to a photovoltaic element with excellent characteristics and high reliability and a method for producing the photovoltaic element, and more specifically to a photovoltaic element with excellent characteristics and a reduced loss in energy conversion efficiency due to the formation of a bypass diode under a current collecting electrode and a method for producing the photovoltaic element.

2. Related Background Art

A thin film type solar cell employing amorphous semiconductor is considered promising due to its advantages such as its capabilities of forming a large-area solar cell, making the film thickness of a semiconductor thinner and depositing a film on an arbitrary substrate, as compared to a single-crystal or polycrystal type solar cell.

An amorphous silicon type solar cell is formed, for example, by stacking p-, i- and n-type thin amorphous silicon layers on a substrate. Also, for improving the energy conversion efficiency, there is contemplated a so-called double or triple cell structure in which two or more of the above-mentioned pin junctions are superposed in series. At the light incident side and the back side of the above-mentioned semiconductor, there are formed a pair of electrodes, namely an upper electrode and a lower electrode. In the amorphous silicon type solar cell, because of the generally high sheet resistance of the semiconductor itself, there is required a transparent upper electrode covering the entire area of the semiconductor, which is usually composed of a transparent conductive film such as of $SnO_2$ or ITO. Such transparent conductive film functions also as an anti-reflective film. On the upper electrode mentioned above, there is provided a current collecting grid electrode which is formed into a comb-shaped pattern so as not to hinder the entry of light, in other words, the irradiation of light, and a busbar is provided in order to collect the current from the grid electrode.

As an electric power supply source, a single solar cell (photovoltaic element) is incapable of supplying a sufficient output voltage. For this reason, it is necessary to use plural solar cells in parallel or serial connection. The largest difficulty in utilizing the plural cells (elements) in serial connection as described above relates to the situation wherein no electric power is generated due to a part of the cells being shadowed from the sunlight, for example, by a building or by accumulated snow. A serially connected solar cell module can no longer generate an electric power even though other cells in the module still generate electric power, and the total voltage generated by the normally functioning cells is applied, as a backward voltage, to such a shadowed cell. When such a backward voltage exceeds the tolerable voltage of the element, destruction thereof may result. In order to prevent such a problem in the electric power generation or the destruction of the element, it is necessary to connect, for each of the serially connected elements, a diode parallel to the element but in a direction opposite to that of the semiconductor junction of the element. Such a diode is generally called a bypass diode.

Figure 9:
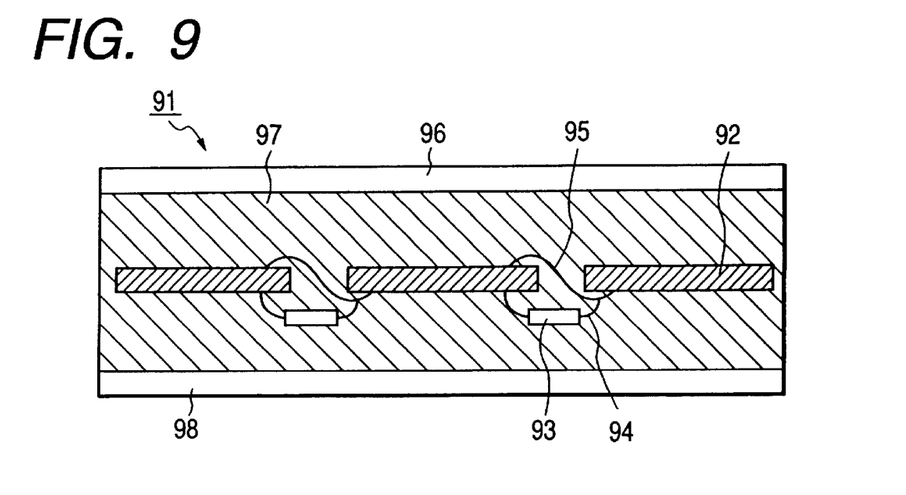
FIG. 9 is a schematic cross-sectional view showing the serial configuration of the conventional photovoltaic elements.

The application of the bypass diode to the solar cell is, for example, disclosed in Japanese Patent Application Laid-Open No. 5-152596, in which a mold-packaged diode is connected in parallel to each solar cell. FIG. 9 is a schematic view showing an example of the solar cell module utilizing such bypass diode. FIG. 9 shows a solar cell module 91 connected to bypass diodes, solar cells 92, bypass diodes 93, wirings 94, wirings 95 for serially connecting the solar cells 92, a glass plate 96, an encapsulating resin 97, and a back plastic material 98. As the diode 93 has a thickness of about 3 mm in diameter in the case of a usual axial diode, the encapsulating resin 97 has to be made correspondingly thick.

There is proposed a method of incorporating a diode in a semiconductor constituting a solar cell, as another method of the prior art, because the attachment of an independent diode to the solar cell is considered to increase the thickness of a solar cell module by the thickness of the diode and complicate the manufacturing process with respect to the wiring work. Such a proposal is disclosed, for example, in Japanese Patent Application Laid-Open No. 4-42974, in which a pn junction functioning as a solar cell and a pn junction serving as a bypass diode are formed on the same substrate in such a manner that they are mutually connected in parallel.

However, with respect to such a conventional photovoltaic element with the bypass diode, (1) in the photovoltaic element employing an amorphous semiconductor film formed on the aforementioned substrate, there has not been disclosed a method of forming the bypass diode on the same substrate, (2) the configuration and the producing method require a masking process, which is complex and lacks freedom in size, and (3) the area of the bypass diode constitutes a loss in the effective area of the photovoltaic element; in other words, it is necessary to increase the area of the solar cell by the area of the bypass diode.

SUMMARY OF THE INVENTION

In consideration of the above-mentioned problems of the conventional technology, an object of the present invention is to provide a photovoltaic element formed by depositing a photovoltaic element portion and a bypass diode portion on the same substrate, while applying a semiconductor obtained by film formation to the portions, without involving a complex process, whereby the bypass diode portion does not reduce the effective area of the photovoltaic element with a high freedom in size, and a producing method therefor.

In order to attain the above-mentioned object, the present invention provides a photovoltaic element comprising: a photovoltaic layer having a first semiconductor junction layer for generating a photoelectromotive force, a current collecting electrode provided at the light incident side of the photovoltaic layer, and a bypass diode connected in parallel, wherein the bypass diode is formed under the current collecting electrode as a bypass diode layer having a second semiconductor junction layer other than the first semiconductor junction layer of the photovoltaic layer.

Also, the present invention provides a method of producing a photovoltaic element, which comprises a step of forming, on a conductive substrate or a substrate with a conductive film formed thereon, a photovoltaic layer having a first semiconductor junction layer for generating a photoelectromotive force in plural positions with a predetermined space, a step of forming a bypass diode layer having a second semiconductor junction layer with a forward direction of a semiconductor junction opposite to that of the first semiconductor junction layer, on the substrate between the plural positions of the photovoltaic layer, and a step of forming a current collecting electrode so as to be connected to the photovoltaic layer and the bypass diode layer.

Because the bypass diode layer is formed under the current collecting electrode, the photovoltaic layer, for example, having a pin or pn semiconductor junction deposited on a substrate, and the bypass diode layer can be easily formed by forming a film on the same substrate. Consequently the surface of the element can be planar and there can be dispensed with the step of wiring the bypass diode which is conducted by using a separate component in the conventional technology. Also the manufacturing process is simplified and is improved in reliability and production yield. Furthermore, the bypass diode layer does not sacrifice the effective area of the photovoltaic layer.

DETAILED DESCRIPTION OF THE PREFERRED EMBODIMENTS

In the present embodiment, the semiconductor material for forming the photovoltaic element may be crystalline or amorphous, but is preferably one capable of forming a thin semiconductor film on the substrate. Such thin semiconductor films are usually formed by a usual vacuum film forming process, but similar effects can also be obtained by a liquid phase process. The photovoltaic layer and the bypass diode layer may be simultaneously formed in the above-mentioned film forming process, but they may also be formed separately with different film forming apparatuses. When the substrate is long, the film formation can be executed by a roll-to-roll process. In view of productivity, there is preferably used a process in which the semiconductor layers are deposited in succession while the substrate is transported through plural film forming chambers. Also, there is a leaf-by-leaf process, in other words, a sheet-by-sheet process in which the semiconductor layers are deposited in succession in the course of transportation of the substrate. This process is also preferable.

In the present embodiment, the forward direction of each junction of the first and second semiconductor junction layers is mutually opposite. More specifically, the bypass diode layer as the second semiconductor junction layer is formed so as to have a pn or pin junction with a forward direction opposite to that of the photovoltaic layer as the first semiconductor junction layer, so as to be provided in parallel with respect to the photovoltaic layer, and so as to maintain the surface of the layers at the same level. In order to change the semiconductor film formed on the substrate, a mask can be used. More specifically, in the case of forming the amorphous semiconductor by a vacuum process utilizing plasma CVD, there may be positioned a plate for covering the substrate in a part of the vacuum chamber, for example, in the width direction of the substrate where the current collecting electrode is to be formed, in order to prevent film formation in such a covered position.

Figure 1:
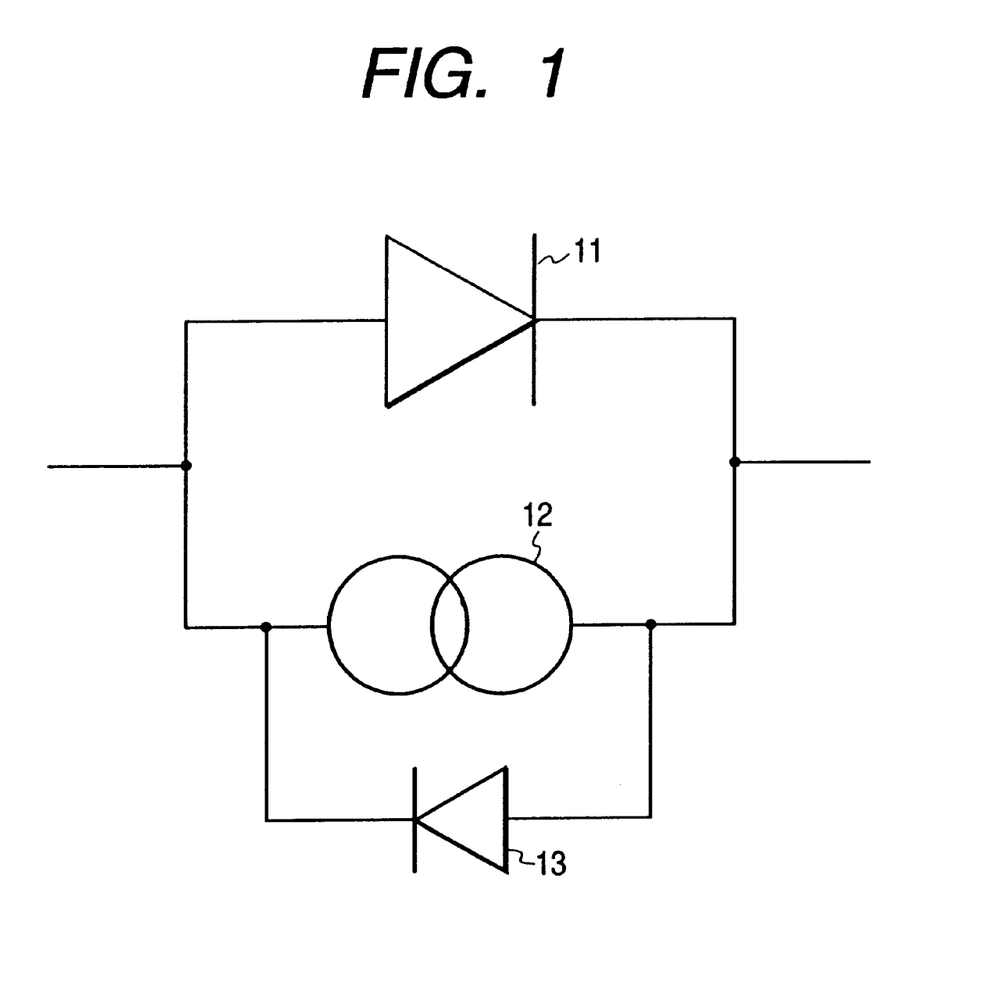
FIG. 1 is a diagram showing an equivalent circuit of the photovoltaic element according to the present invention.

The photovoltaic element of the present embodiment is produced by forming a photovoltaic layer and the bypass diode layer on the same substrate, but the bypass diode layer has to be connected in parallel to the photovoltaic layer and formed so that the surface of the bypass diode is the same level as that of the photovoltaic layer. Also the forward directions of semiconductor junctions of the layers have to be mutually opposite to each other. FIG. 1 shows an equivalent circuit having the connection of the photovoltaic element and the bypass diode. FIG. 1 shows a diode component 11 of the photovoltaic layer, a DC power source component 12 of the photovoltaic layer, and a bypass diode layer 13. The above-described configuration can be obtained by forming one polar of the photovoltaic layer and one polar of the bypass diode layer on the same substrate, and mutually connecting the other polars with a metal electrode. Specifically, the photovoltaic layer and the bypass diode layer are both connected to the current collecting electrode as the metal electrode at the light incident side.

Figure 2:
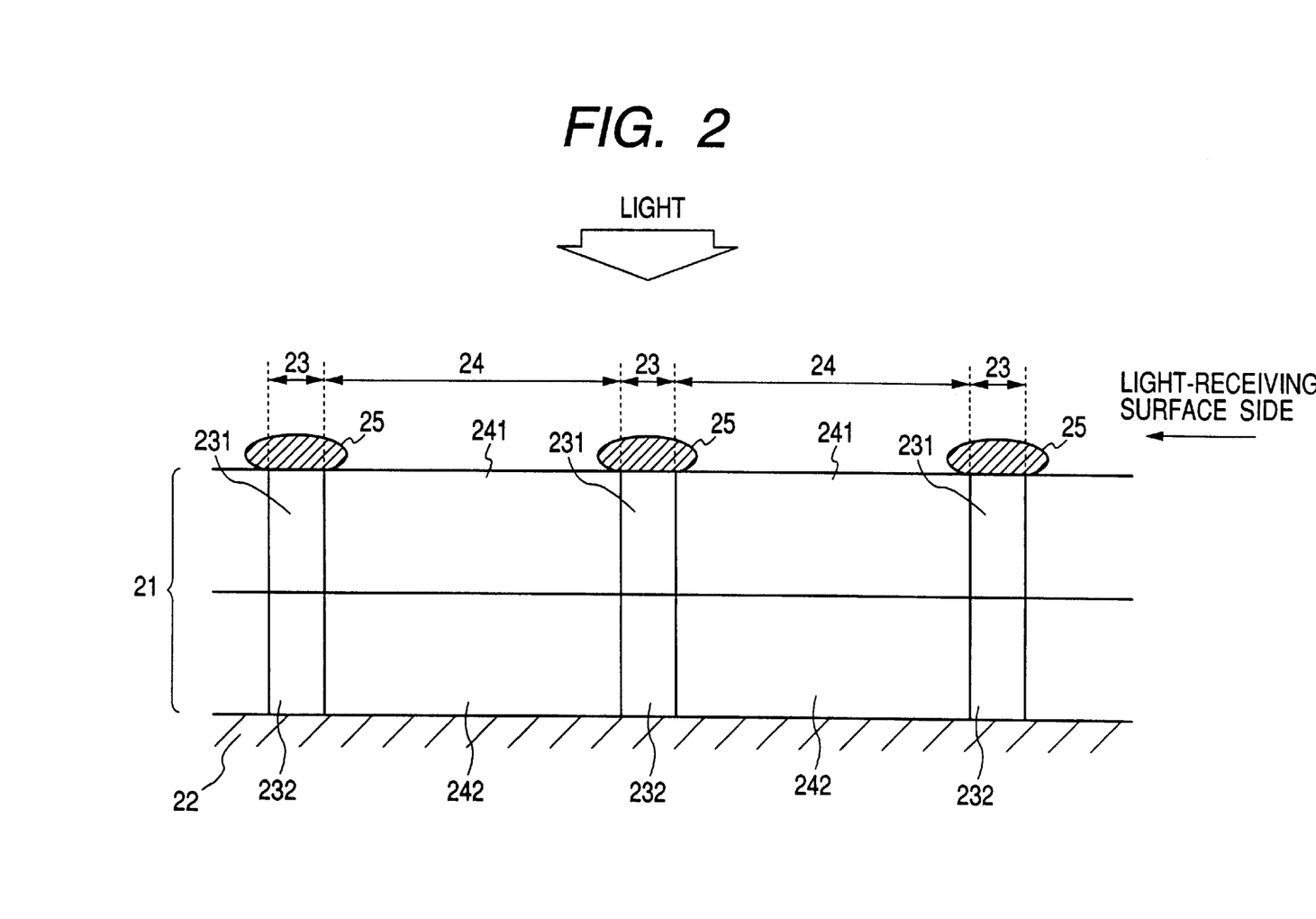
FIG. 2 is a schematic cross-sectional view showing on example of the semiconductor layer configuration of the photovoltaic element according to the embodiment of the present invention.

The above-described configuration is shown in FIG. 2. FIG. 2 is a schematic cross-sectional view showing one example of the semiconductor layer configuration of the photovoltaic element according to the present embodiment. As shown in FIG. 2, a semiconductor layer 21 is provided on a substrate 22, and linear current collecting electrodes 25 are further provided thereon with an interval therebetween. The side of the current collecting electrodes 25 is a light incident side. The semiconductor layer 21 has a bypass diode layer 23 and a photovoltaic layer 24. The bypass diode layer 23 and the photovoltaic layer 24 are alternately provided adjacent to each other. The current collecting electrode 25 is formed just on the bypass diode layer 23 so as not to hinder incident light. Further, the current collecting electrode 25 is connected to the bypass diode layer 23, and the ends of the current collecting electrode 25 are connected to the photovoltaic layer 24. The bypass diode layer 23 is composed of a plurality of semiconductor layers 231 and 232 different in characteristics from each other in this order from the light-receiving side toward the side of the substrate 22. FIG. 2 shows one example in which the bypass diode layer has a two-layered structure of a p-type layer and an n-type layer. Similar to the bypass diode layer 23, the photovoltaic layer 24 is composed of a plurality of semiconductor layers 241 and 242 different in characteristics from each other, and, as one example the photovoltaic layer is composed of a p-type layer and an n-type layer. The semiconductor layers 231 and 241 are different in characteristics from each other, in other words, when one semiconductor layer is a p-type layer, the other semiconductor layer is an n-type layer. Similarly, the semiconductor layers 232 and 242 are different in characteristics from each other.

The photovoltaic layer and the bypass diode layer are laterally formed adjacent to each other on the same substrate and are formed in mutually parallel belt-like shapes of the substantially same length, both in the roll-to-roll feeding method or in the leaf-by-leaf feeding method. By forming these layers in mutually parallel belt-like shapes substantially equal in length of at least a long side thereof, and by dividing a large photovoltaic element along the long side of the belt-like shape, it is possible to obtain a small photovoltaic element of an arbitrary width which contains a desired number of the belt-like photovoltaic layer and the belt-like bypass diode layer.

The photovoltaic element of the present embodiment may be produced, except for one shown in FIG. 2, by simultaneously forming at least one of the semiconductor layers constituting the first semiconductor junction layer and at least one of those constituting the second semiconductor junction layer with the same material. For example, when each of the first and second semiconductor junction layers is a pin junction layer including an intrinsic layer, the intrinsic layer may be continuously extended over both semiconductor junction layers. In such a case, the intrinsic layer (i-type layer) may be provided in common to both the first and second semiconductor junction layers, though the order of deposited layers of the pin junctions is different in the first and second semiconductor junction layers. Such configuration may be obtained by forming the i-type layers of both junction layers with the same material at the same time during formation of the first and second semiconductor junctions layers with a pin junction. After forming the i-type layer, the surface of a layer formed on the i-type layers on the both junction layers can be adjusted to the same level.

The first semiconductor junction layer as the photovoltaic layer may have a triple cell structure of three stacked semiconductor layers each having a pin or pn junction, and the second semiconductor junction layer as the bypass diode layer may have a single cell structure of a single semiconductor layer having a pin or pn junction. Such a configuration allows simplification of the manufacturing process. For example, when the first semiconductor junction layer is composed of three stacked pin junctions, the bypass diode layer can be formed during formation of the p-type layer of the bottom pin junction, the i-type layer of the middle pin junction and the n-type layer of the top pin junction. That is, the third, fifth and seventh layers among nine layers constituting the first semiconductor junction layer are respectively formed simultaneously with the first, second and third layers constituting the second semiconductor junction layer using the same materials. In other words, the third layer among nine layers constituting the first semiconductor junction layer is formed simultaneously with the first layer constituting the second semiconductor junction layer using the same material; the fifth layer among nine layers constituting the first semiconductor junction layer is formed simultaneously with the second layer constituting the second semiconductor junction layer using the same material; and the seventh layer among nine layers constituting the first semiconductor junction layer is formed simultaneously with the third layer constituting the second semiconductor junction layer using the same material.

First Semiconductor Layer

The semiconductor layers constituting the first semiconductor junction layer can be composed of thin semiconductors such as amorphous silicon, microcrystalline silicon or polycrystalline silicon. In case the present invention is applied to a pin-type amorphous silicon solar cell, the semiconductor material constituting the i-type layer can include so-called Group IV or Group VI alloy type amorphous or microcrystalline semiconductors such as a-Si:H, a-Si:F, a-Si:H:F, a-SiGe:H, a-SiGe:F, a-SiGe:H:F, a-SiC:H, a-SiC:F or a-SiC:H:F. The semiconductor material constituting the p-type or n-type layer can be obtained by doping the above-mentioned semiconductor material constituting the i-type layer with a valence electron controlling substance. As the valence electron controlling substance for obtaining the p-type semiconductor, there is employed a compound containing an element of Group III of the periodic table. The element of Group III includes B, Al, Ga and In. Also as the valence electron controlling substance for obtaining the n-type semiconductor, there is employed a compound containing an element of Group V of the periodic table. The element of Group V includes P, N, As and Sb.

The amorphous or microcrystalline silicon semiconductor layer can be formed by a known method such as evaporation, sputtering, plasma CVD, microwave plasma CVD, VHFCVD, ECR, thermal CVD or LPCVD. For industrial application, there is principally employed RF plasma CVD in which a raw material gas is decomposed by RF plasma and deposited onto the substrate. The RF plasma CVD process is associated with drawbacks in that the decomposition efficiency of the raw material gas is as low as about 10% and the deposition rate is as low as 1 to 10 Å/sec; microwave plasma CVD and VHF plasma CVD are contemplated in order to overcome these drawbacks. As the apparatus for executing the film formation mentioned above, there can be employed a known film-forming apparatus of batch or continuous type depending on necessity. The photovoltaic element of the present invention is applicable also to so-called tandem cells in which two or more semiconductor junctions are stacked in order to improve the spectral sensitivity or to increase the output voltage.

In order to individually form the photovoltaic layer and the bypass diode layer, there may be provided a deposition preventing plate (mask) for preventing the film deposition in the vacuum chamber. In this case, the leaf-by-leaf feeding apparatus may be used. Also, the first semiconductor junction layer of the photovoltaic layer is formed in the order of n, i and p, while the second semiconductor junction layer of the bypass layer is formed in the order of p, i and n.

Figure 4A:
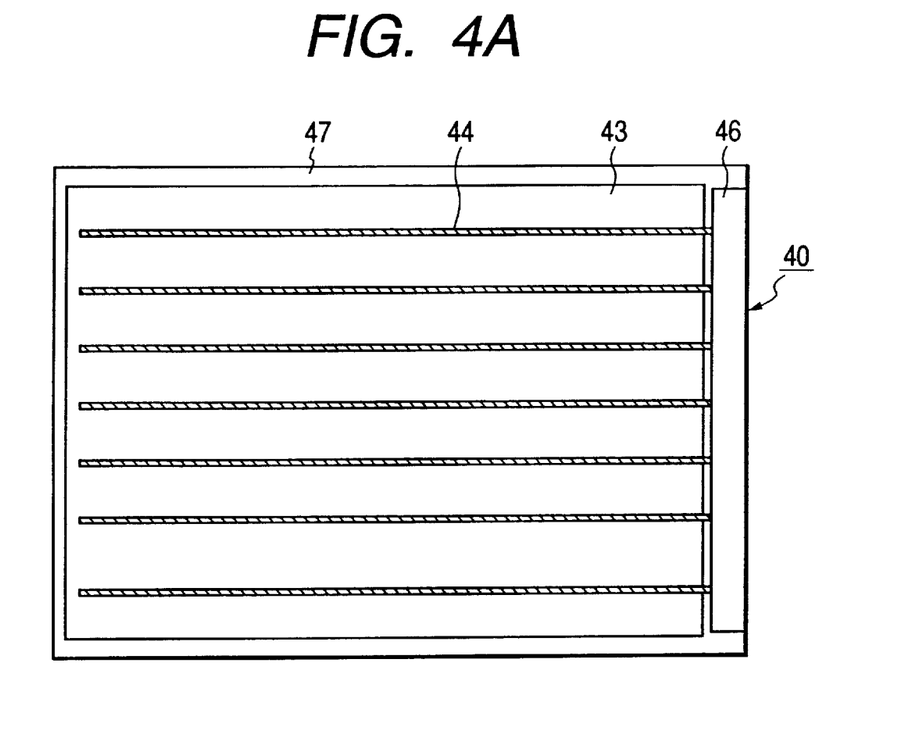
FIGS. 4A and 4B are respectively a plan view and a cross-sectional view showing the entire photovoltaic element shown in FIGS. 3A, 3B and 3C.
Figure 4B:
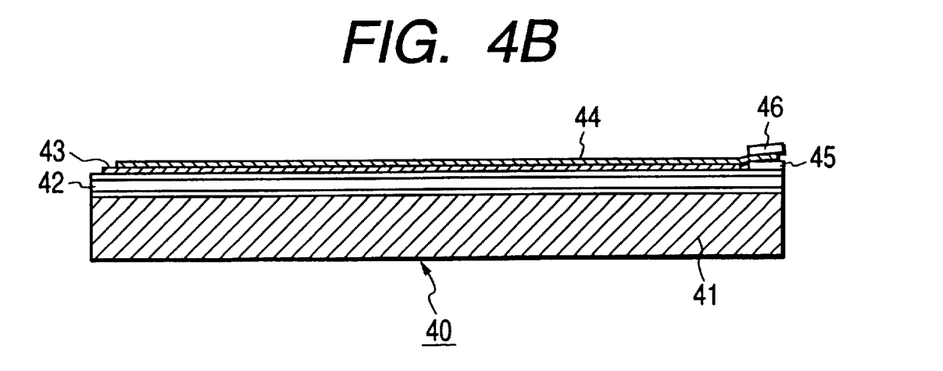

Next, the members constituting the solar cell having the photovoltaic element according to the present embodiment are described. The structure of this solar cell is shown in FIGS. 4A and 4B, but the explanation of FIGS. 4A and 4B will be described later.

Substrate

Though the substrate is not essential in the present invention, an advantageous configuration can be obtained by forming thin semiconductor films on a substrate with an appropriate shape or size. For example, when the substrate is composed of a metal, the substrate can be used not only for mechanically supporting the thin films such as the semiconductor layers and the electrode layer, but also for functioning as an electrode (first electrode). The substrate can be composed of a conductive or insulating material, but when the substrate is composed of an insulating material, the surface of the substrate is subjected to a conductive treatment to utilize it as an electrode. Such a substrate is required to have heat resistance capable of withstanding the heating temperature in formation of the semiconductor layers and the electrode layer. It is also required to be of a continuous long form in the case of the roll-to-roll film-forming process, and further required to be dimensionally stable without elongation, in order to enable winding under tension.

Among the substrate materials meeting the above-described requirements, the preferred conductive substrate includes a thin plate composed of a metal such as Fe, Ni, Cr, Al, Mo, Au, Nb, Ta, V, Ti, Pt, Pb or Ti, an alloy thereof such as brass or stainless steel, or a composite material thereof, a carbon sheet or a zinc-plated steel plate. Particularly preferred is stainless steel because of various features such as satisfactory heat resistance to the heating temperature during film formation and high mechanical strength suitable for continuous film formation such as in a roll-to-roll system, for example, even in the case of a thickness as small as 0.15 mm. Also, among the substrate materials, a preferred insulating substrate includes a heat-resistant resin film or sheet such as polyester, polyethylene, polycarbonate, cellulose acetate, polypropylene, polyvinyl chloride, polyvinylidene chloride, polystyrene, polyamide, polyimide, epoxy resin, a composite material of such resin material with glass fibers, carbon fibers or boron fibers, glass or a ceramic material. Particularly preferred is a glass or polyimide substrate.

Upper Electrode

The photovoltaic layer may have an upper electrode at the light incident side thereof. Such an upper electrode is not essential to the present invention, but is provided for reducing the sheet resistance in case the first semiconductor junction layer is composed of a material of high resistance such as amorphous silicon. It is not necessary to provide the upper electrode when the sheet resistance is low as in the case of crystalline materials including microcrystal. The upper electrode serves to gather the electromotive force generated in the first semiconductor junction layer and functions as a pair with the first electrode at the substrate side. The upper electrode is required to gather the current in a direction parallel to the substrate when utilizing a semiconductor material of high sheet resistance such as amorphous silicon, and preferably has a sheet resistance not exceeding 300 $\Omega/\square$. The thickness of the upper electrode must be designed so as to have a sufficiently low resistance and satisfactory transparency, and in some cases, to minimize the light reflection at the wavelength of the light to be transmitted, based on the light interference condition. For example, in order to minimize the reflection of light of 550 nm using ITO as the upper electrode, there is preferred a thickness of about 700 Å. Also, the above-mentioned upper electrode (second electrode) is positioned at the light incident side and preferably has a light transmittance of at least 85% in order that the light from the sun or a white fluorescent lamp is efficiently absorbed by the semiconductor layer. Examples of the preferred material with such characteristics include metal oxides such as $SnO_2$, $In_2O_3$, ZnO, CdO, $CdSnO_4$ and ITO ($In_2O_3+SnO_2$). The upper electrode (second electrode) can be formed with a known method such as evaporation, sputtering or reactive sputtering.

Current Collecting Electrode

The current collecting electrodes are provided with an interval therebetween on the light-receiving side. Further, the current collecting electrodes are formed in a comb-like shape on the upper (second) electrode and as an electrode of low resistance for improving the energy conversion efficiency of the photovoltaic element, because the current collection directly from the second electrode of high sheet resistance results in a low energy conversion efficiency by the high series resistance. The width and pitch of the current collecting electrodes are designed so as to minimize electrical resistance in current collection and shadow loss. The current collecting electrode is required to have a low specific resistivity and not to contribute series resistance with respect to the photovoltaic element. The specific resistivity is preferably within a range of $10^{-2}$ to $10^{-6}$ $\Omega$cm. The current collecting electrode is composed of a metal such as Ti, Cr, Mo, W, Al, Ag, Ni, Cu, Sn, Pt or Cu, an alloy thereof or solder. The current collecting electrode can be formed by printing of so-called conductive paste, which consists of the above-mentioned powdered metallic material mixed with a polymer binder and a solvent for the binder in an appropriate ratio, plating of the above-mentioned metallic material, or placing of a wire of the above-mentioned metallic material.

The comb-shaped current collecting electrode may be formed in a desired shape and position by sputtering, resistance heating or CVD, while employing a mask of a desired shape. There may also be employed a method of evaporating a metal over the entire surface and patterning the obtained metal layer by etching, a method of directly forming the pattern of the current collecting electrode by photo CVD, a method of forming a mask of the negative pattern of the current collecting electrode followed by plating, or a method of screen printing a conductive paste. The above-mentioned screen printing method consists of printing the conductive paste through a screen having a desired pattern on a polyester or stainless steel mesh and can provide a current collecting electrode of a width of about 50 $\mu$m at minimum. The printing can be advantageously executed in a commercially available screen printing machine. The screen printed conductive paste is heated in a drying oven, in order to crosslink the binder and to evaporate the solvent. The drying oven can be a hot air oven or an infrared oven.

The current collecting electrode may also be formed with a metal wire. In such case, there is advantageously employed a metal wire such as Ti, Cr, Mo, W, Al, Ag, Ni, Cu, Sn, Pt or Cu with a diameter preferably within a range of 50 $\mu$m to 200 $\mu$m. The current collecting electrode can be provided by adhering the metal wire to the second electrode with a conductive adhesive. The metal wire may be coated in advance with the conductive adhesive. Further, the current collecting electrode may be provided directly on the bypass diode layer. In this case, the upper electrode must be connected to both the photovoltaic layer and the current collecting electrode.

BusBar

In the present invention, the busbar may be employed if necessary. The busbar serves as an electrode for further collecting the currents in the current collecting electrode to an end. The busbar can be composed of a metal such as Ag, Pt or Cu or an alloy thereof. The busbar may be formed in a wire, a foil or a conductive paste similar to that employed for the current collecting electrode. The foil-shaped busbar may be composed, for example, of a copper foil or a tin-plated copper foil, optionally coated with an adhesive. The busbar may be formed by fixing a metal wire with conductive adhesive, or by adhering a copper foil. Otherwise it may be formed in a similar manner to the case of the current collecting electrode.

Second Semiconductor Junction Layer

The second semiconductor junction layer in the bypass diode layer is composed of thin semiconductor layers deposited on the aforementioned substrate and having at least a pn or pin junction as described above and is formed by using almost the same materials and method as in the case of the first semiconductor junction layer. The second semiconductor junction layer may be formed simultaneously with or separately from the first semiconductor junction layer. For example, in case the photovoltaic element is shielded from light, the bypass diode performs a function of bypassing an operation current generated by other photovoltaic elements connected in series and is required to be capable of bypassing the operation current at the operation point of the photovoltaic element. For this purpose, the operation current and the operation voltage of the bypass diode are determined according to the desired specifications of the photovoltaic elements. The operation current of the bypass diode may be increased or decreased, for example, by increasing or decreasing the area of the bypass diode layer or the impurity density in the semiconductor layer.

In the following there will be explained examples of the present invention, but it is to be understood that the present invention is not limited by these examples.

EXAMPLE 1

Figure 3A:
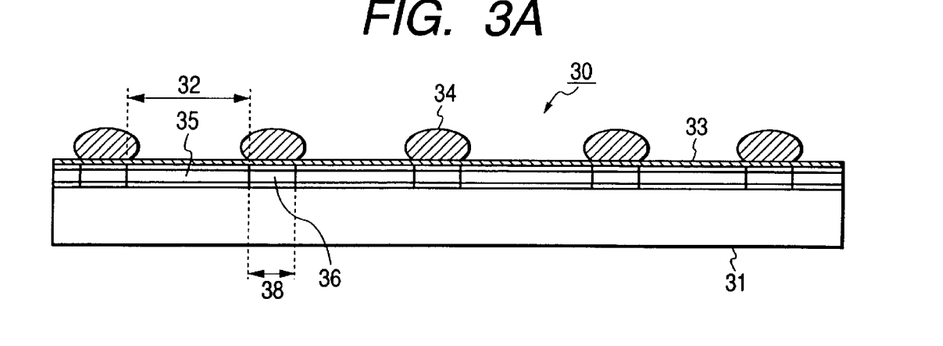
FIGS. 3A, 3B and 3C are schematic cross-sectional views showing three different configurations of the photovoltaic element according to the present invention.
Figure 3B:
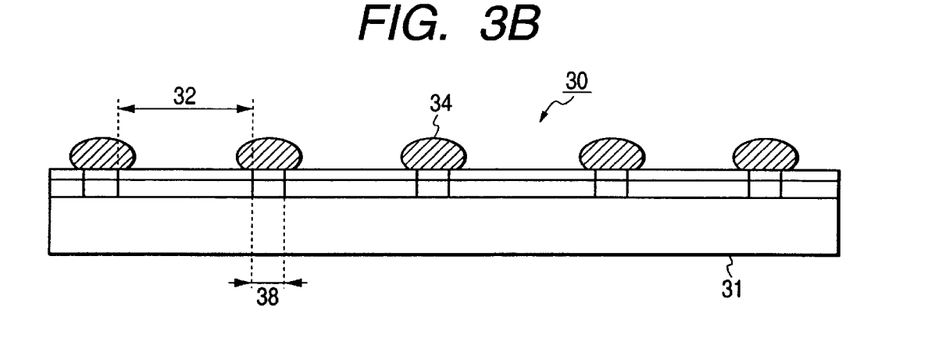
Figure 3C:
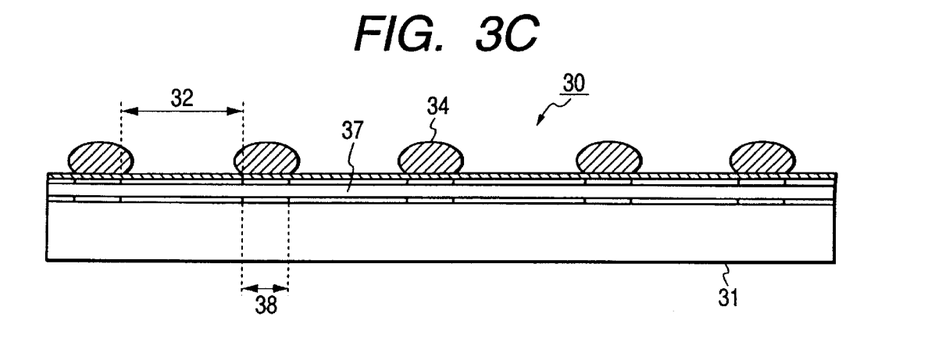

FIGS. 3A to 3C are schematic cross-sectional views showing bypass diode portions in three kinds of photovoltaic elements with bypass diodes, according to the examples of the present invention. As shown in these drawings, each of photovoltaic elements 30 is composed of a photovoltaic layer 32 having a semiconductor junction layer for generating a photoelectromotive force and a current collecting electrode 34 provided on a bypass diode layer 38. The bypass diode layer 38 is composed of a second semiconductor junction layer other than the first semiconductor junction layer in the photovoltaic layer 32.

In the element shown in FIG. 3A, each of the semiconductor junction layers of the photovoltaic layer 32 and the bypass diode layer 38 is formed so as to have one pin junction. There is also provided an upper electrode 33 at the light-receiving surface side. An intrinsic layer 36 of the bypass diode layer 38 and an intrinsic layer 35 of the photovoltaic layer 32 are formed separately. In the element shown in FIG. 3B, each of the semiconductor junction layers of the photovoltaic layer 32 and the bypass diode layer 38 is formed so as to have one pn junction formed by thin films, and there is no upper electrode because the thin films have a small sheet resistance. In the element shown in FIG. 3C, the intrinsic layer of the photovoltaic layer 32 and the intrinsic layer 37 of the bypass diode layer 38 are commonly provided so as to continuously cover both semiconductor junction layers. FIGS. 4A and 4B are respectively a plan view seen from the light-receiving surface side and a cross-sectional view of the entire photovoltaic element having the configurations shown in FIGS. 3A to 3C. FIG. 4B is a cross-sectional view along the current collecting electrode 44.

The photovoltaic element shown in FIG. 3A was produced in the following manner. At first, a sufficiently degreased and rinsed substrate 31 of SUS430BA (0.2 mm in thickness) was placed in a RF plasma CVD apparatus not shown in the drawings and then subjected to deposition of n-type, i-type and p-type layers in this order, thereby obtaining the semiconductor junction layer of the photovoltaic layer 32. In this operation, the substrate 31 was masked with a polyimide adhesive tape in lines of a width of 1 mm spaced with a gap of 5 mm therebetween, in order to prevent formation of the semiconductor junction layer in the masked area. That is, the semiconductor junction layer of the photovoltaic layer 32 was formed in plural positions mutually separated by a gap of 1 mm.

Then the substrate 31 having the semiconductor junction layer formed thereon was placed in a resistance heating type evaporation apparatus not shown in the drawings and subjected to the evaporation of In-Sn alloy by resistance heating under an internal pressure of $1 \times 10^{-4}$ Torr while introducing oxygen to deposit a transparent ITO upper electrode 33 of a thickness of 700 Å having also an anti-reflective effect, thereby completing the photovoltaic layer 32.

Then the above-mentioned mask was removed from the substrate 31, the photovoltaic layer 32 was masked instead, and the above-mentioned CVD film forming apparatus was employed to deposit p-type, i-type and n-type layers in this order to complete the bypass diode 38. The bypass diode layer 38 having the p-type, i-type and n-type layers was formed so that the surface of the bypass diode layer was at the same level as that of the photovoltaic layer 32 adjacent to the bypass diode layer. Further, the upper electrode 33 was formed on the bypass diode layer 38 so that the surface of the upper electrode 33 formed on the bypass diode layer 33 was at the same level as that of the upper electrode formed on the photovoltaic layer 32.

Subsequently the circumference of the upper electrode 33 was etched to form an area 47 in which the semiconductor was exposed. Then an insulating tape 45 was adhered to an end of the substrate 31.

Then a copper wire of a diameter of 100 µm, coated with a conductive resin consisting of carbon black dispersed in urethane resin, was positioned on the bypass diode layer 38 so as to be in contact with the upper electrode 33 and was fixed onto the upper electrode 33 and the insulating tape 45 by heating for 10 minutes at 200° C. under a pressure of 1 kg/cm², thereby completing the current collecting electrode 34.

Then a busbar 46 consisting of a copper foil of a thickness of 100 µm was adhered onto the current collecting electrode 44 so as to overlap the insulating tape 45, whereby the photovoltaic element with the bypass diode shown in FIG. 3A was completed.

Ten samples of this photovoltaic element were produced in the same manner.

Then these samples were subjected to resin-sealing (encapsulation) as follows. At first, EVA resins were placed on and under the substrate 31. In this case, the bypass diode layer and the photovoltaic layer were covered with the EVA resin. The EVA resin at the light incident side had a thickness of 250 µm. Further, a fluororesin film was stacked on the light incident side so as to overlap the EVA resin, while a metal plate was stacked on the back side so as to overlap the EVA resin. Then, the stacked components were subjected to vacuum lamination in a vacuum laminator for 60 minutes at 150° C. in order to conduct hot-pressing.

Then, each encapsulated sample was subjected to the measurement of initial characteristics according to the output measuring method for the amorphous solar cell module, defined in JIS C8935. At first the energy conversion efficiency was determined by measuring the solar cell characteristics with a solar simulator light source (manufactured by SPIRE Co., hereinafter referred to as "simulator") with a light of 100 mW/cm² at an AM1.5 global sunlight spectrum. The obtained characteristics were satisfactory with little fluctuation, and the shadow loss was 4.5%.

Then the samples were subjected to reliability measurement according to the temperature-humidity cycle test A-2 defined in the environmental and durability test methods for the amorphous solar cell module in JIS C8938. Specifically, the sample was placed in a constant temperature/humidity container with controllable temperature and humidity and was subjected to a cycle test by varying the temperature from −40° C. to +85° C. (85% relative humidity) ten times. Upon the observation after testing, the samples showed satisfactory appearance without any peeling or bubbling of the laminating materials.

As explained in the foregoing, the photovoltaic element of the present example was produced by integrating the bypass diode portion with the photovoltaic layer and providing the bypass diode layer 38 under the current collecting electrode 34. It is therefore possible to reduce shadow loss, to make planar the entire photovoltaic element, thereby allowing thinner lamination materials to be employed, and to obtain satisfactory reliability.

COMPARATIVE EXAMPLE 1

For the purpose of comparison, a photovoltaic element 92 with the conventional bypass diode 93 as shown in FIG. 9 was produced in substantially the same manner as in Example 1. More specifically, the same method as in Example 1 there was conducted up to the formation of an upper electrode (not shown in the drawings) on a substrate (not shown in the drawings), and then the current collecting electrode and the busbar were formed thereon to obtain the photovoltaic element 92.

Subsequently the diode 93 was connected to the photovoltaic element 92, and lamination (encapsulation) was executed in the same manner as in Example 1 to obtain a solar cell module 91. In this operation, the lamination material was varied in thickness as 250 μm, 500 μm, 1 mm and 3 mm. The filing was insufficient at thicknesses not larger than 1 mm, but satisfactory at a thickness of 3 mm.

The foregoing results indicate that the photovoltaic element with bypass diode of Example 1 can provide a solar cell module thinner than that with the conventional photovoltaic element 92, thereby allowing for a reduction of the amount of lamination material.

EXAMPLE 2

In this example, a photovoltaic element module (not shown in the drawings) was formed by serial connection of photovoltaic elements 40 with bypass diodes having the configuration shown in FIGS. 4A and 4B. Specifically, at first there were produced ten photovoltaic elements with bypass diodes of the configuration shown in FIGS. 4A and 4B. The busbar 46 of each photovoltaic element was connected through an interconnector to the substrate 41 of an adjacent photovoltaic element, and this connection was repeatedly conducted to obtain ten photovoltaic elements connected in series.

Then the photovoltaic elements connected in series were subjected to encapsulation in the following manner. Specifically, at first, EVA resins were stacked on and under each substrate 41, i.e., on the light incident side and the opposite side thereof. The EVA resin on the light incident side had a thickness of 250 μm. Then a fluororesin film was further stacked on the light incident side, while a metal plate was stacked on the back side. Then the stacked components were subjected to vacuum lamination in a vacuum laminator for 60 minutes at 150° C.

Then, the connected encapsulated photovoltaic elements were subjected to measurement of the initial characteristics according to the output measuring method for the amorphous solar cell module, defined in JIS C8935. Specifically, at first, the energy conversion efficiency was determined by measuring the solar cell characteristics with the solar simulator light source (manufactured by SPIRE Co., hereinafter referred to as "simulator") with light of 10 mW/cm$^2$ at an AM1.5 global sunlight spectrum. The obtained characteristics were satisfactory with little fluctuation.

Then the reliability was measured by the hot spot test A-1 defined in the environmental and durability test methods for the amorphous solar cell module in JIS C8938. Specifically, at first, the sample was irradiated with light of 100 mW/cm$^2$ in the solar simulator, while one photovoltaic element among the serially connected ten photovoltaic elements-containing module (ten photovoltaic elements connected in series) was shadowed. After standing for ten minutes in this condition, the solar cell characteristics were measured with the simulator in the same manner as in the measurement of the initial characteristics, but no significant degradation was observed in comparison with the initial conversion efficiency.

The foregoing results indicate that the solar cell comprising the photovoltaic elements of the present example has satisfactory characteristics, can avoid hot spot damage resulting from a partial shadow, and has high reliability.

COMPARATIVE EXAMPLE 2

For the purpose of comparison, conventional photovoltaic elements without the bypass diode were produced in substantially the same manner as in Example 1. More specifically, at first there was executed the same method as in Example 1 up to the preparation of the upper electrode on the substrate. Then an insulating layer with an adhesive material was adhered to both ends of the substrate, and the current collecting electrode was formed in the same manner as in Example 1. Then the busbar consisting of a copper foil was stacked to complete the photovoltaic element.

Then, ten photovoltaic elements thus produced were connected in series, and the serial photovoltaic elements thus obtained were encapsulated in the same manner as in Example 1.

The encapsulated photovoltaic elements were subjected to measurement of the initial characteristics in the same procedure as in Example 1 and to the evaluation of the reliability in the same manner as in Example 2. The measurement after tests revealed that the energy conversion efficiency decreased by about 7.5%. The cause of the decrease in efficiency was analyzed and attributed to the shunting of the photovoltaic element in the shadowed area which was generated by the application of a reverse bias to such a shadowed photovoltaic element.

EXAMPLE 3

Figure 5:
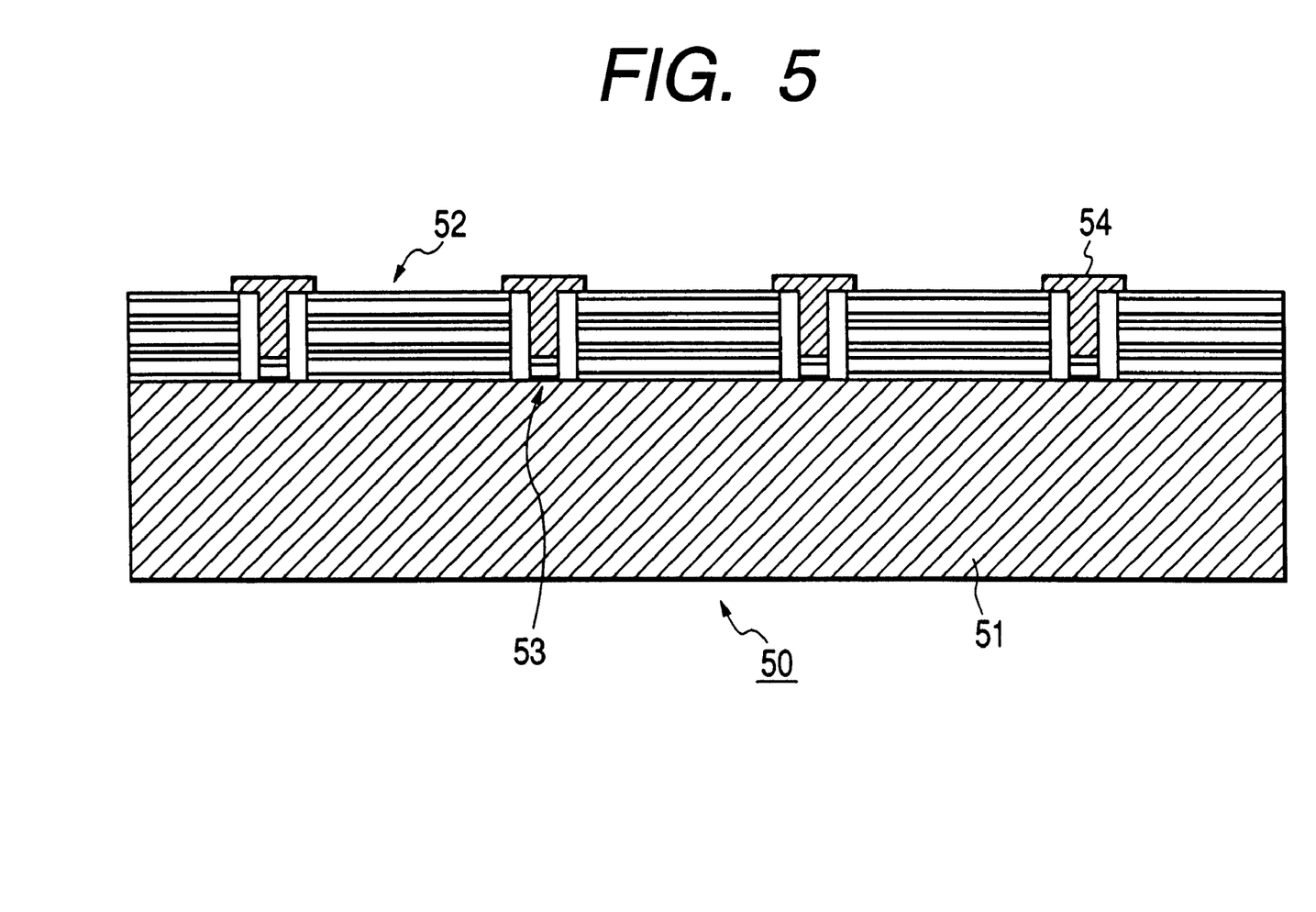
FIG. 5 is a schematic cross-sectional view showing the configuration of a photovoltaic element according to Example 3 of the present invention.

FIG. 5 is a cross-sectional view of the photovoltaic element of Example 3 of the present invention. As shown in FIG. 5, the photovoltaic layer 52 in this photovoltaic element 50 has a triple cell structure, in which the semiconductor junction layer consists of three stacked semiconductor layers each including a pin junction. On the other hand, the bypass diode layer 53 has a single cell structure, in which the semiconductor junction layer includes only one semiconductor layer having a pin junction. The photovoltaic layer 52 and the bypass diode layer 53 are formed laterally adjacent to each other on the same substrate 51, wherein the forward directions of the respective semiconductor junction layers are mutually opposite to each other. The photovoltaic layer 52 and the bypass diode layer 53 are connected to the current collecting diode 54 at the light incident side. Similarly, there can be formed a photovoltaic element comprising a photovoltaic layer 52 having a triple cell structure of pn junctions and a bypass diode layer 53 having a single cell structure of a pn junction.

Figure 6A:
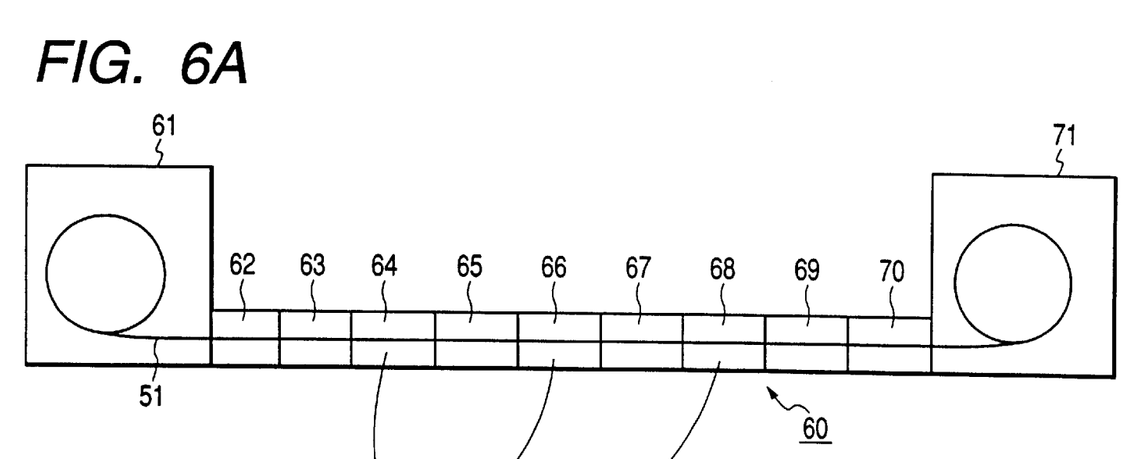
FIGS. 6A and 6B are schematic views showing a method of producing the photovoltaic element according to Example 3 of the present invention.
Figure 6B:
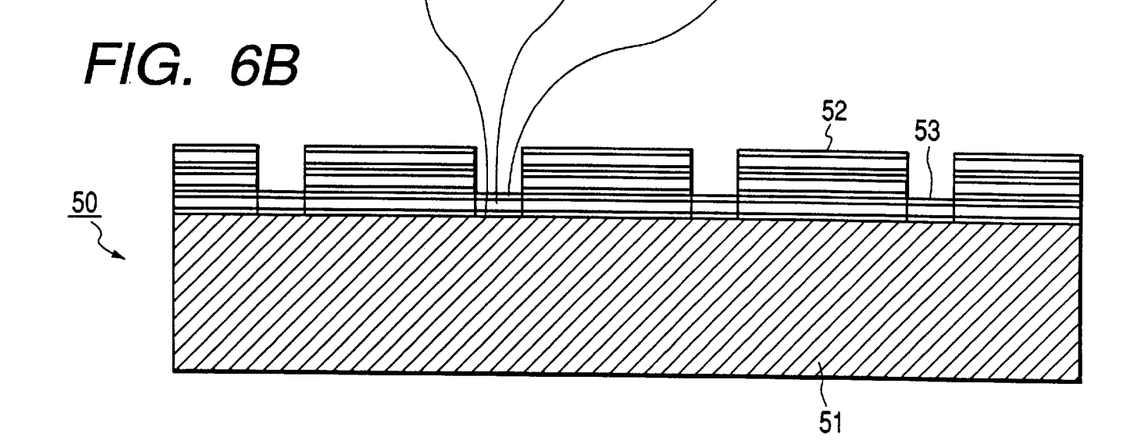
Figure 7A:
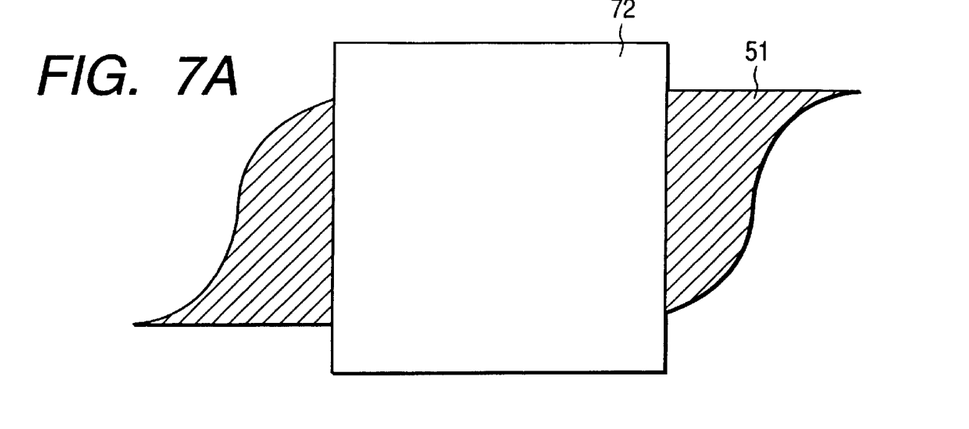
FIGS. 7A and 7B are schematic views showing a part of the producing apparatus to be employed in the producing method shown in FIGS. 6A and 6B.
Figure 7B:
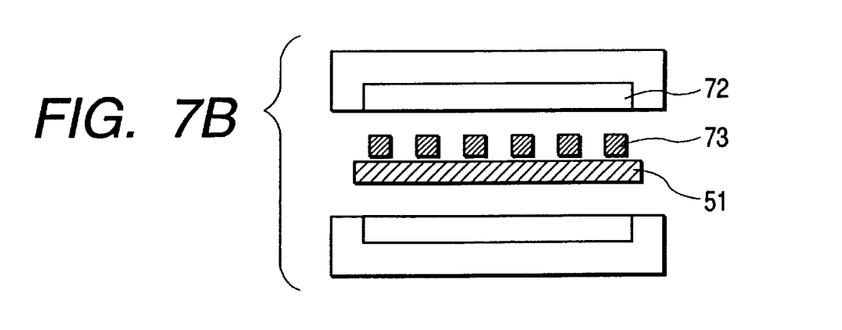

FIGS. 6A, 6B, 7A and 7B show a method of forming the photovoltaic element 50 in a roll-to-roll process by a triple cell film-forming apparatus 60. FIG. 6A is a schematic cross-sectional view of the film-forming apparatus utilizing the roll-to-roll process. As shown in FIG. 6A, there are arranged film-forming chambers 62 to 70 in this order. Among them, the chambers 62, 65 and 68 are used for forming n-type layers, the chambers 63, 66 and 69 are used for forming i-type layers and the chambers 64, 67 and 70 are used for forming p-type layers to obtain triple cells. FIGS. 7A and 7B are a plan view and a cross-sectional view showing a state of passing the substrate through the chamber provided with a mask (baffle plates). Except for the chambers 64, 66 and 68 for forming the p-type layer of the bottom layer, the i-type layer of the middle layer and the n-type layer of the top layer, each chamber 72 is provided with baffle plates 73 for intercepting the plasma as shown in FIG. 7B, thereby preventing film formation on a part of the substrate 51. The baffle plates 73 are positioned corresponding to the plural current collecting electrodes 54 and are provided with a width substantially equal to that of the current collecting electrode 54. By employing the above-described structure, the p-type layer of the bottom layer, the i-type layer of the middle layer and the n-type layer of the top layer is formed on a part of the substrate 51 to complete the bypass diode layer 53 on the substrate, while forming the semiconductor junction layers of the photovoltaic layer 52 on the substrate. In other words, the third, fifth and seventh layers among nine semiconductor layers constituting the semiconductor junction layer of the photovoltaic layer 52 are respectively formed simultaneously with the first, second and third layers of three semiconductor layers constituting the semiconductor junction layer of the bypass diode layer 53 by using the same materials.

The above-described apparatus was used for forming the photovoltaic element 50 shown in FIG. 5 in the following manner. At first, as shown in FIG. 6A, a coiled long SUS430 substrate 51 was set in a feeding chamber 61 of the film-forming apparatus and was transported at a constant speed to a wind-up chamber 71 at the other end, and the photovoltaic layer 52 and the bypass diode layer 53 were formed on the substrate 51 as shown in FIG. 6B in the course of transportation. Then another vacuum chamber not shown in the drawings was used to form the upper electrode only on the photovoltaic layer 52. After the film formation, the long substrate 51 was cut into sheets of a length of 20 cm. Subsequently, an upper electrode at the periphery of each cut substrate was removed by etching as in Example 1, and a current collecting electrode and a busbar were formed.

Then ten photovoltaic elements 50 thus produced were encapsulated as in Example 1 to obtain ten samples of the photovoltaic element.

The obtained samples were subjected to measurement of the initial characteristics in the same manner as in Example 1. The samples showed satisfactory conversion efficiency within a range of 8.5±1.5%, with a shadow loss as small as 4.5% and with little fluctuation.

EXAMPLE 4

Figure 8A:
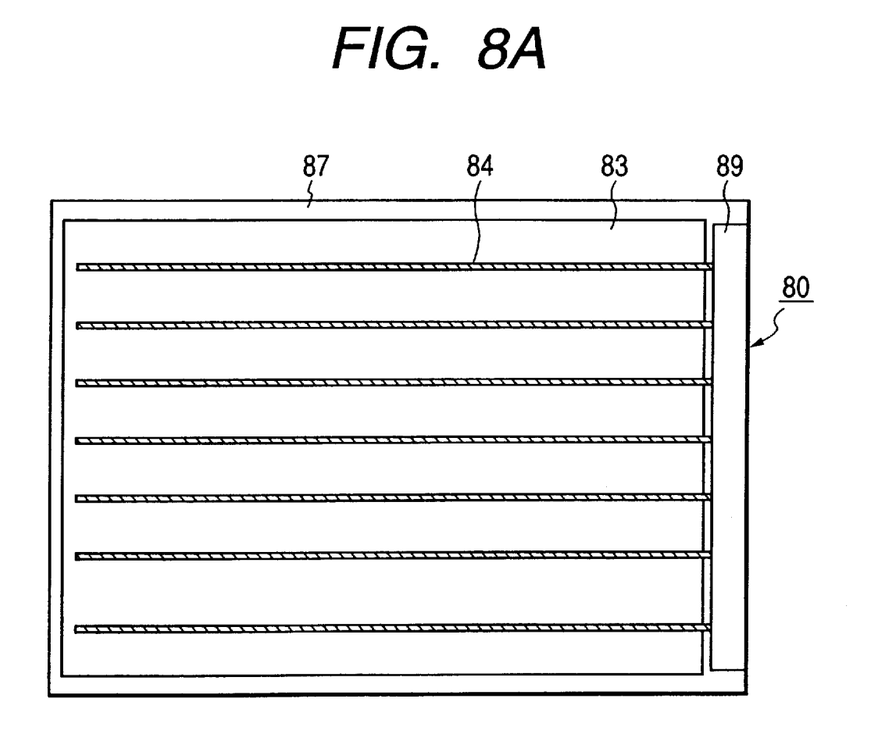
FIGS. 8A and 8B are schematic views showing a method of obtaining the photovoltaic element by division, according to Example 4 of the present invention.
Figure 8B:
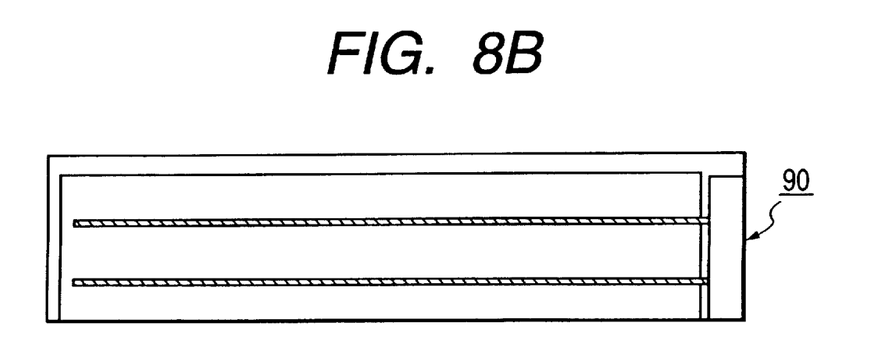

In this example, there was produced a photovoltaic element 80 with bypass diode of a configuration shown in FIG. 8A, and such photovoltaic element was then divided to obtain separate photovoltaic elements with an arbitrary width such as a photovoltaic element 90 shown in FIG. 8B.

At first, there was executed the process of Example 1 up to the formation of the upper electrode 83, and the upper electrode 83 in a portion to be divided and in the periphery of the substrate to form a region 87 was exposed. Then the current collecting electrode 84 was fixed in the same manner as in Example 1. Further, the current collecting electrode 84 and the busbar 89 were fixed with a silver paste to complete the photovoltaic element 80 with a bypass diode of a configuration shown in FIG. 8A.

Subsequently, the photovoltaic element 80 thus produced was subjected to measurement of the conversion efficiency. Thereafter, the photovoltaic element was divided into four pieces along the etching lines to obtain the photovoltaic elements 90 as shown in FIG. 8B. These photovoltaic elements 90 were subjected to measurement of the conversion efficiency.

Comparison of the conversion efficiencies of the photovoltaic elements 80 and 90 revealed that the conversion efficiency barely varied before and after the division, thereby indicating no damage by division. Consequently it is possible to obtain a photovoltaic element with a bypass diode that can be divided into an arbitrary widths.

As explained in the foregoing, the present invention capable of providing the bypass diode layer including the second semiconductor junction under the current collecting electrode by film formation can provide the photovoltaic element with high conversion efficiency and low shadow loss without using a complex process.

Also, because the photovoltaic layer and the bypass diode layer are formed in a parallel belt-like shape of substantially the same length, the photovoltaic element can be divided into photovoltaic elements with an arbitrary width.

Furthermore, as the intrinsic layer constituting the first semiconductor junction layer and the intrinsic layer constituting the second semiconductor junction layer are continuously formed, the photovoltaic element can be produced in a simple manner.

Furthermore, because the first semiconductor junction layer has a triple cell structure consisting of three stacked semiconductor layers each including a pn or pin junction and the second semiconductor junction layer has a single cell structure, the photovoltaic element can be produced in a simple manner.

What is claimed is:

1. A photovoltaic element comprising:
   a photovoltaic layer having a first semiconductor junction layer for generating a photoelectromotive force,
   a current collecting electrode provided at a light incident side of the photovoltaic layer, and
   a bypass diode connected in parallel,
   wherein the bypass diode is formed under the current collecting electrode as a bypass diode layer having a second semiconductor junction layer, and
   wherein each of the first and second semiconductor junction layers comprises an intrinsic layer which continuously extends over both semiconductor junction layers and which extends into the bypass diode layer.

2. The photovoltaic element according to claim 1, wherein the photovoltaic layer and the bypass diode layer are formed in a parallel belt-like shape of substantially the same length.

3. The photovoltaic element according to claim 1, wherein the photovoltaic layer has a triple cell structure with the semiconductor junction layer consisting of three stacked semiconductor layers each including a pin or pn junction and the bypass diode layer has a single cell structure with the semiconductor junction layer consisting of a semiconductor layer including a pin or pn junction.

4. The photovoltaic element according to claim 1, wherein the photovoltaic layer and the bypass diode layer are formed laterally adjacent to each other on the same substrate.

5. The photovoltaic element according to claim 1, wherein forward directions of semiconductor junctions of the first and second semiconductor junction layers are mutually opposite to each other, and the photovoltaic layer and the bypass diode layer are connected to the current collecting electrode at the light incident side.

6. A method of producing a photovoltaic element according to claim 1, wherein the second semiconductor layer is formed so as to be flush with the first semiconductor layer and the fourth semiconductor layer is formed so as to be flush with the third semiconductor layer.

7. A method of producing a photovoltaic element comprising the steps of:
    forming, on a conductive substrate or a substrate with a conductive film formed thereon, a photovoltaic layer having a first semiconductor junction layer for generating a photoelectromotive force in plural positions with a predetermined interval therebetween,
    forming a bypass diode layer having a second semiconductor junction layer with a forward direction of a semiconductor junction opposite to that of the first semiconductor junction layer, on the substrate between the plural positions of the photovoltaic layer, and
    forming a current collecting electrode on the bypass diode layer so as to be connected with the photovoltaic layer and the bypass diode layer,
    wherein each of the first and second semiconductor junction layers is formed so as to have a pin junction, and the i-type layer of each of the first and second semiconductor junction layers is simultaneously formed with the same material and extends into the bypass diode layer.

8. The method of producing a photovoltaic element according to claim 7, wherein, at the formation of the photovoltaic layer and the bypass diode layer, at least one of the semiconductor layers constituting the first semiconductor junction layer and at least one of the semiconductor layers constituting the second semiconductor junction layer are simultaneously formed with the same material.

9. The method of producing a photovoltaic element according to claim 8, wherein the first semiconductor junction layer is formed with three stacked semiconductor layers each including a pin junction and the second semiconductor junction layer is formed with a semiconductor layer including a pin junction, and wherein a third, a fifth and a seventh semiconductor layer among nine semiconductor layers constituting the first semiconductor junction layer are respectively formed simultaneously with a first, a second and a third semiconductor layer of three semiconductor layers constituting the second semiconductor junction layer using the same materials.

10. A photovoltaic element comprising:
    a conductive plane;
    a photovoltaic layer and a bypass diode layer provided on the conductive plane; and
    a current collecting electrode provided on the bypass diode layer;
    wherein a plurality of separate photovoltaic layers is provided on the conductive plane, the bypass diode layer is provided in a separation region between adjacent photovoltaic layers and in contact with the plurality of photovoltaic layers.

11. The photovoltaic element according to claim 10, wherein the photovoltaic layer has a first semiconductor junction layer, wherein the bypass diode layer has a second semiconductor junction layer, and wherein a forward direction of the first semiconductor junction layer and a forward direction of the second semiconductor junction layer are opposite with respect to a normal direction of the conductive plane, and the first semiconductor junction layer and the second semiconductor junction layer are in contact with each other.

12. The photovoltaic element according to claim 10, wherein the photovoltaic layer and the bypass diode layer are flush with each other.

13. The photovoltaic element according to claim 10, wherein the photovoltaic layer has an intrinsic layer and the intrinsic layer extends into the bypass diode layer.

14. A method of producing a photovoltaic element comprising the steps of:
    forming a plurality of photovoltaic layers provided with a separation region on a conductive plane;
    forming a bypass diode layer in the separation region, wherein the bypass diode layer is formed so that the bypass diode layer is brought into contact with the plurality of photovoltaic layers; and
    forming a current collecting electrode on the bypass diode layer.

15. The method of producing a photovoltaic element according to claim 14, wherein the photovoltaic layer has a first semiconductor junction layer, wherein the bypass diode layer has a second semiconductor junction layer, and wherein a forward direction of the first semiconductor junction layer and a forward direction of the second semiconductor junction layer are opposite with respect to a normal direction of the conductive plane, and the first semiconductor junction layer and the second semiconductor junction layer are in contact with each other.

16. The method of producing a photovoltaic element according to claim 14, wherein the bypass diode layer is formed so as to be flush with the photovoltaic layers.

17. A method of producing a photovoltaic element comprising the steps of:
    forming a first semiconductor layer constituting a part of a plurality of photovoltaic layers provided with a separation region on a conductive plane;
    forming a second semiconductor layer constituting part of a bypass diode layer in the separation region;
    forming an intrinsic layer on the first and the second semiconductor layers;
    forming a third semiconductor layer constituting a part of the plurality of the photovoltaic layers on the first semiconductor layer through the intrinsic layer;
    forming a fourth semiconductor layer constituting a part of the bypass diode layer on the second semiconductor layer through the intrinsic layer; and
    forming a current collecting electrode on the fourth semiconductor layer.

18. The method of producing a photovoltaic element according to claim 17, wherein the photovoltaic layer has a first semiconductor junction layer having the first and the third semiconductor layers, wherein the bypass diode layer has a second semiconductor junction layer having the second and the fourth semiconductor layers, and wherein a forward direction of the first semiconductor junction layer and a forward direction of the second semiconductor junction layer are opposite with respect to a normal direction of the conductive plane, and the first semiconductor junction layer and the second semiconductor junction layer are in contact with each other.

19. The method of producing a photovoltaic element according to claim 17, wherein the second semiconductor layer is formed so as to be flush with the first semiconductor layer.

20. A method of producing a photovoltaic element according to claim 17, wherein the fourth semiconductor layer is formed so as to be flush with the third semiconductor layer.

* * * * *

UNITED STATES PATENT AND TRADEMARK OFFICE
CERTIFICATE OF CORRECTION

PATENT NO. : 6,184,458 B1
DATED : February 6, 2001
INVENTOR(S) : Tsutomu Murakami et al.

It is certified that error appears in the above-identified patent and that said Letters Patent is hereby corrected as shown below:

Column 2,
Line 2, "diode." should read -- diodes. --.

Column 6,
Line 60, "in" should read -- in the --.

Column 8,
Line 27, "such" should read -- such a --.

Column 11,
Line 11, "there" should be deleted.

Column 12,
Line 31, "of the" should read -- of --.

Column 13,
Line 27, "by" should be deleted; and
Line 54, "with" should read -- with a --.

Column 14,
Line 13, "an" should be deleted.

Signed and Sealed this

Twelfth Day of March, 2002

*Attest:*

*Attesting Officer*

JAMES E. ROGAN
*Director of the United States Patent and Trademark Office*